United States Patent [19]

Pekol

[11] Patent Number: 5,573,174
[45] Date of Patent: Nov. 12, 1996

[54] AUTOMATIC REFLOW SOLDERING SYSTEM

[76] Inventor: Robert Pekol, 3102 Aspen Ct., Eau Claire, Wis. 54703

[21] Appl. No.: 290,074

[22] Filed: Aug. 15, 1994

[51] Int. Cl.$^6$ .............................. B23K 1/012; H05K 3/34
[52] U.S. Cl. .......................... 228/219; 228/42; 219/85.17; 432/152; 432/242
[58] Field of Search .............................. 228/42, 219, 220, 228/221, 234.1, 102, 180.21; 219/85.17, 392, 394; 432/121, 122, 239, 250, 152, 242, 241

[56] References Cited

U.S. PATENT DOCUMENTS

| | | | |
|---|---|---|---|
| 3,982,887 | 9/1976 | Kendziora et al. | 432/152 X |
| 4,586,898 | 5/1986 | Orbeck | 432/239 X |
| 5,031,818 | 7/1991 | Gieskes | 228/42 |
| 5,195,674 | 3/1993 | Nishi | 228/42 |

OTHER PUBLICATIONS

Brochure entitled "Manncrop Report", Special Nepcon West Edition, 1994 Spring Edition.
Hot SMT News, Quad ZCR Ovens by Quad Systems; Horsham, Pennsylvania; date unknown.
Micri–Flo XG, Forced Convention SMT Reflow System by Research Inc., Minneapolis, Minnesota; 1992.
Brochure entitled "HVC Series Forced Convection Reflow Soldering System", by Conceptronic, Portsmouth, New Hampshire; 1993.
Brochure entitled "UNITHERM Forced Convection Reflow Soldering Systems" by Vitronics Corporation, Newmarket, New Hampshire date unknown.

*Primary Examiner*—Kenneth J. Ramsey
*Attorney, Agent, or Firm*—Frederick W. Niebuhr, Esq.

[57] ABSTRACT

A reflow soldering system includes a reflow station with one or more soldering containers. Each container includes a base and a cover reciprocable to either open or close the container. When open, the container receives a printed circuit board/electrical circuit component assembly for reflow soldering, or permits the exit of such assembly after soldering. When closed, the container provides a fluid-tight seal between the chamber inside and the immediate outside environment. Container opening and closure are synchronized with an input conveyor providing assemblies to the container and an output conveyor removing the soldered assemblies, both of which are operated by a control system at a controlled rate of speed. When the container is closed, its internal environment is precisely controlled through heating elements in the container and several conduits for supplying air (heated if desired), for supplying an inert gas, and for drawing a vacuum. Further embodiment soldering systems employ pluralities of the containers and guides for selectively diverting different assemblies to different containers for enhanced flexibility and throughput.

20 Claims, 4 Drawing Sheets

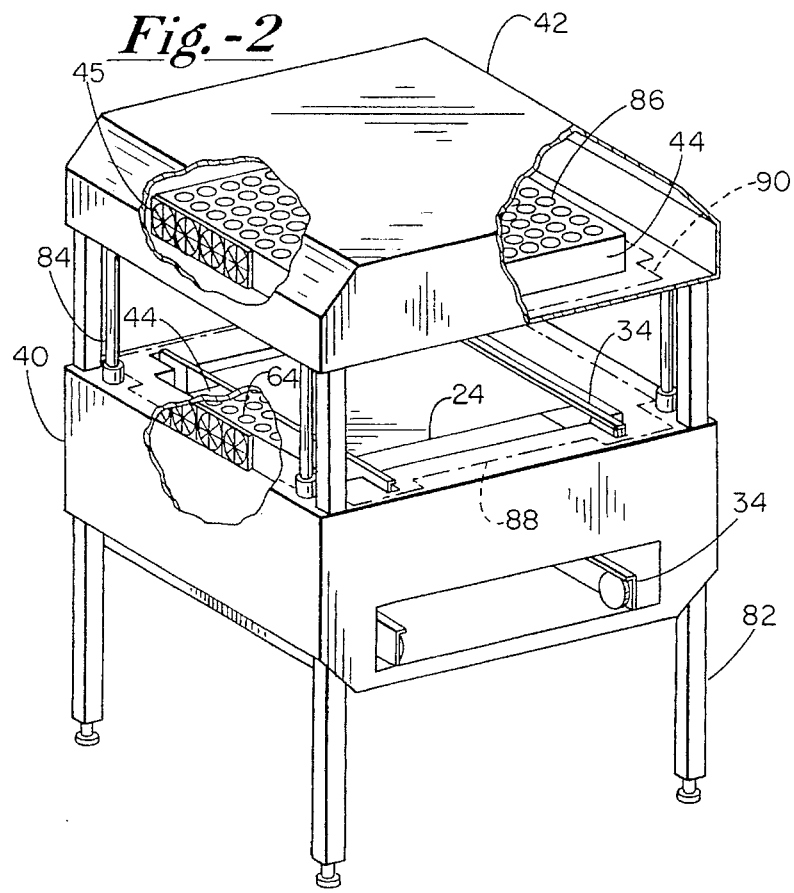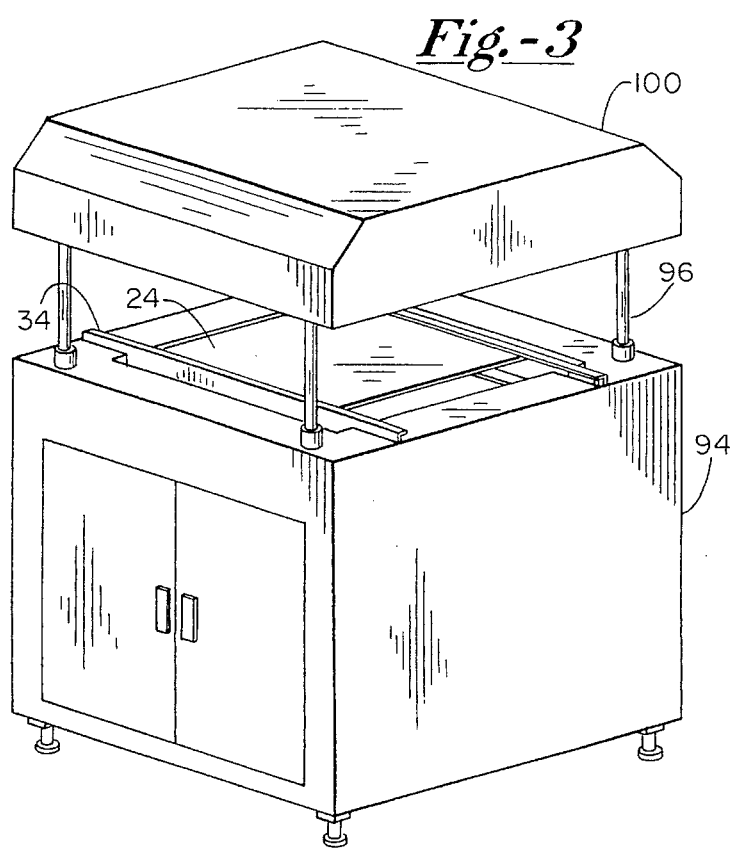

AUTOMATIC REFLOW SOLDERING SYSTEM

BACKGROUND OF THE INVENTION

The present invention relates to reflow soldering of articles, and more particularly to the mounting of electrical circuit components to substrates by reflow soldering.

Electronic components and substrates (typically printed circuit boards) frequently are electrically and mechanically bonded by solder reflow operations. Solder reflow involves applying a solid solder alloy in paste form to the substrate, placing electrical components against the substrate in their intended locations, heating the printed circuit board and components to a temperature above the melting point of the solder alloy, then cooling these components to solidify and establish the electrical and mechanical connections. In what is known as SMT (surface mount technology), printed circuit boards are conveyed in a sequence for application of the solder alloy in paste form, automated placement of circuit components onto the printed circuit board, and a reflow operation that is "in-line", i.e. performed upon the circuit boards and components as they move in sequence.

Known SMT reflow systems are available from Research Inc. of Minneapolis, Minn.; Vitronics Corporation of New Market, N.H.; Manncorp of Huntingdon Valley, Pa.; and Conceptronic of Portsmouth, N.H. In these systems, endless belt conveyors or rails are employed to carry PCB/component assemblies serially and at a constant rate (linear velocity) through a tunnel. The tunnel is selectively heated to provide several different heat zones. The necessary heating is accomplished by natural convection, forced convection, infrared heating or a combination of these approaches. As it progresses through the tunnel, each PCB/component assembly is subject to a "profile" that is a function of line speed and conditions within the various zones. While temperature is the primary variant among zones, other conditions can be varied, e.g. by introducing nitrogen or another inert gas into one or more selected zones.

In general, batch processing equipment is well known as an alternative to in-line processing. In the fabrication of electronic assemblies, batch ovens are commonly used at temperatures below solder reflow temperatures, for moisture removal, curing of adhesives, and environmental testing. Batch ovens can be sealed, which facilitates more precise control of the environment inside the oven. However, because of the required manual handling and slow throughput rates as compared to in-line systems, batch ovens are not considered practical for performing solder reflow operations in a manufacturing environment.

At the same time, the very characteristics that facilitate automation and high throughput for in-line systems, also give rise to several problems. One is the difficulty in precisely controlling the heated tunnel environment. The tunnel must be open at its entrance and exit ends to allow continuity in product movement. It is difficult to control the environment within the tunnel, particularly within zones near the entrance or the exit. Because some interaction between adjacent zones is inevitable, all zones are more difficult to precisely control. More particularly, there are temperature gradients between adjacent zones, and any nitrogen introduced into one of the zones tends to flow into the adjacent zones. Certain desired steps, e.g. drawing a vacuum, are impossible in these tunnels since they must be open at both ends to allow continuous product movement. Thus, in-line systems impose definite limits upon the precision and degree of control over the reflow profile.

Continuous component movement during reflow also imposes minimum size requirements upon in-line equipment. Heated tunnels typically are in the range of 4–12 feet in length, with corresponding total equipment lengths in the range of about 12–20 feet. For a given reflow profile, an increase in throughput requires a corresponding increase in the length of each heat zone and, of course, the tunnel itself. Greater length increases the cost of a system and the floor space required to accommodate it. The moving endless belt conveyor imparts vibration to components during and immediately after reflow, which can diminish the quality and consistency of soldered connections.

Therefore, it is an object of the present invention to provide an automated reflow soldering system that affords more precise control of the reflow profile.

Another object is to provide a reflow soldering enclosure that facilitates more rapid changes in environment immediately surrounding the components undergoing reflow soldering.

A further object is to provide a reflow soldering system in which several enclosures, each performing a reflow soldering operation upon a stationary component assembly, are merged into a fully automated in-line fabrication process.

Yet another object is to provide a reflow soldering system conveniently adjustable to achieve a wide range of throughput rates.

SUMMARY OF THE INVENTION

To achieve these and other objectives, there is provided a reflow soldering system. The system includes a reflow soldering station having at least one soldering container. Each container includes an entrance and an exit, which can be one of the same. Each container further has a receptacle means and a closure means that cooperates with the receptacle means to define a chamber for containing one of a plurality of articles undergoing a reflow soldering operation. Means are provided for reciprocating the closure means relative to the receptacle means, between an open position that allows passage of articles into and out of the container, and a closed position for closing the container to form a fluid-tight seal between the chamber and the environment outside the container. A chamber conveyance means is provided inside each container, for carrying the articles from the entrance to the exit. A conveyance control means halts the chamber conveyance means to position the particular associated article at a processing site within the container for a selected or predetermined time period. The conveyor control means reactuates the conveyance means after the predetermined time period to carry the particular article to the exit. A closure control means closes the container, maintains the container closed during the predetermined time period, and opens the container after the predetermined time period. An environmental control means is operable at least during the predetermined time period, for controllably altering the environment within the chamber toward conditions that facilitate the reflow operation. An input conveyance means transports the articles in sequence at a predetermined constant (or variable) controlled rate to the reflow soldering station, to deliver the particular article to the entrance. An output conveyance means transports the articles away from the soldering station in sequence and at the predetermined constant (or variable) controlled rate.

The system incorporates several advantages of batch processing into a continuous, automated component handling system. First, because the article is stationary during soldering, the container can be substantially smaller in length than conventional in-line equipment, reducing the cost and required floor area. The container's smaller size and fluid-tight seal enable more precision and control over the reflow temperature profile. Temperatures can be increased and decreased more rapidly, and can be kept uniform throughout the smaller, sealed enclosure. Conditions other than temperature can be more precisely controlled. For example, the sealed container facilitates the drawing of a vacuum, either as an end in itself or as a prelude to introducing nitrogen to minimize formation of oxides during soldering. Soldered components can be cooled more rapidly if desired, and in any event are cooled while stationary, for more consistent and reliable solder joints.

Further in accordance with the invention, the reflow soldering station can incorporate several soldering containers. In this event, the input conveyance means includes means for selecting containers and guiding successive articles to different containers. One approach involves a round-robin or daisy-chain alignment of containers, in succession, with an input conveyor. Alternatively, the input conveyor can run along a series of containers, with a sensing and guiding means channeling articles, in succession, to the unoccupied containers in the series. In either event, the potential throughput rate is increased by a factor equal to the number of containers employed.

The preferred container is a two-piece enclosure, with an enclosure top as the receptacle, and an enclosure bottom as a moveable base mounted directly beneath the enclosure top. The enclosure bottom is mounted to lifting mechanisms to provide closure of the two enclosure pieces.

The environmental control means can include several conduits to each container, for example: a vacuum line coupled to a vacuum source; a fluid line coupled to a source of air for convective heating; and a fluid line coupled to a source of nitrogen or other inert gas under pressure. The inert gas also can be heated to provide heat by convection, and radiant heat sources can be mounted within the containers.

Thus in accordance with the present invention, electrical components are subject to precisely controlled environmental conditions during reflow soldering operations. Reflow soldering and subsequent cooling occur while these components are stationary, enhancing repeatability and reliability of electrical and mechanical connections. The ability to employ different numbers of containers enhances system expansion and adjustment to accommodate various throughput rates.

IN THE DRAWINGS

For a further appreciation of the above and other features and advantages, reference is made to the following detailed description and to the drawings, in which:

FIG. 2 is an end elevation of a soldering container employed in the system;

FIG. 3 is an alternative embodiment showing a single conveyor system with a bypass feature using a vertically moveable top enclosure;

DETAILED DESCRIPTION OF THE PREFERRED EMBODIMENTS

Figure 1:
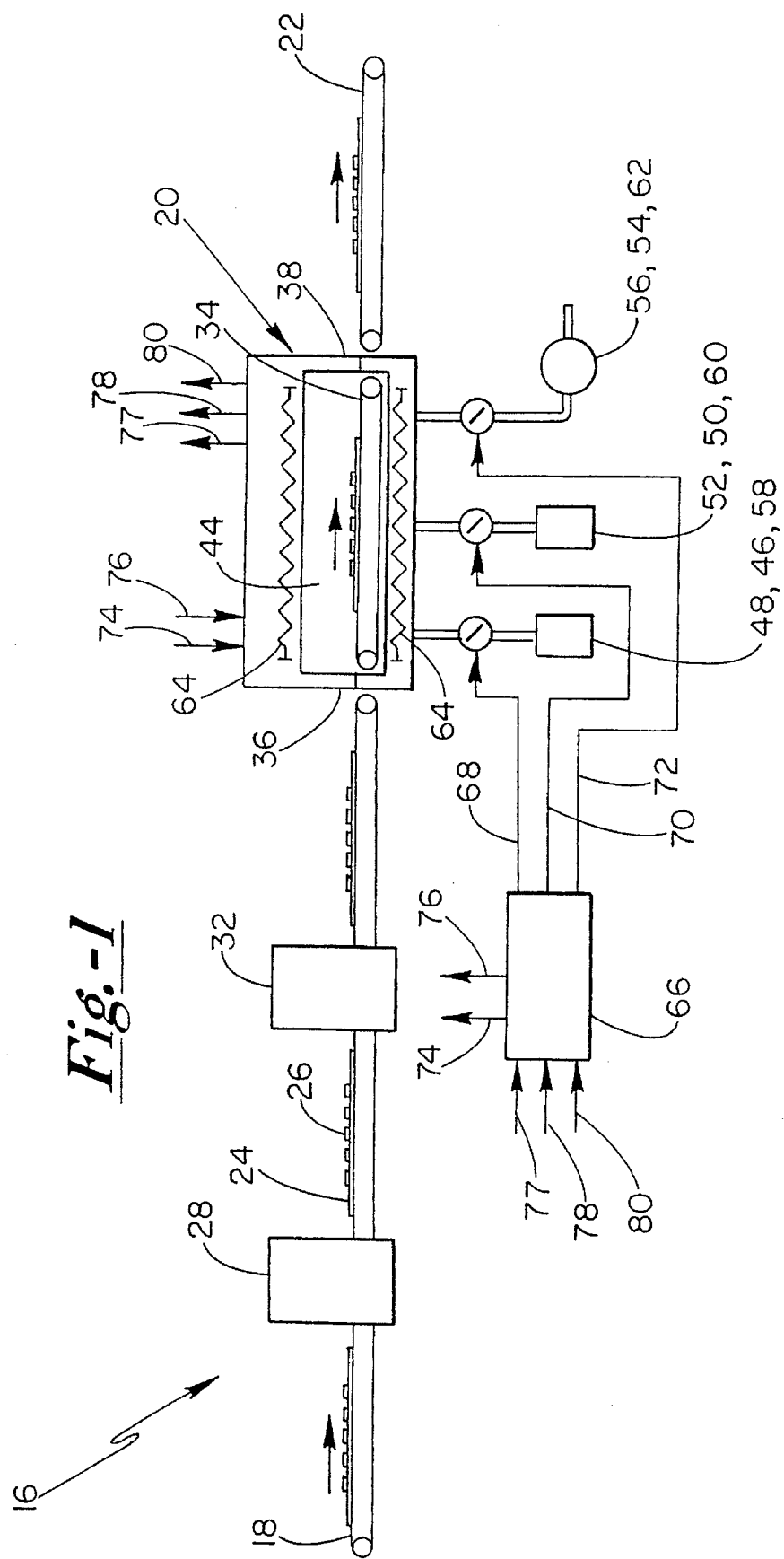
FIG. 1 is a schematic view of an automatic reflow soldering system constructed according to the present invention.
Figure 4:
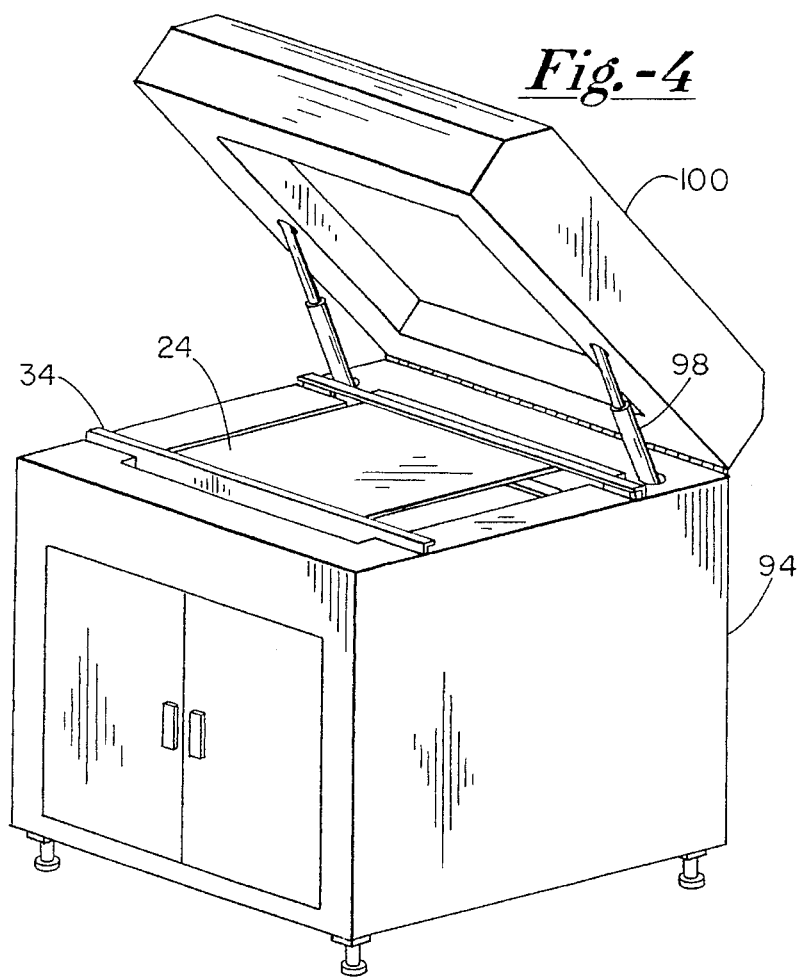
FIG. 4 is a side elevation of an alternative embodiment soldering container.

Turning now to the drawings, there is shown in FIG. 1 a system 16 for automatically performing reflow soldering operations on articles, more particularly printed circuit boards and electrical circuit components to be mounted onto the circuit boards. System 16 includes an input conveyor 18 for transporting the articles to be soldered, a container 20 in which the components are soldered, and an output conveyor 22 for transporting soldered components and substrates away from the container.

The substrates are printed circuit boards (PCB's), shown at 24a–e. The electrical components, shown at 26a–c are, for example, resistors, capacitors, and packages including semiconductor devices. Input conveyor 18 is an endless belt conveyor that travels at a controlled rate of speed as it carries printed circuit boards 24 rightward as viewed in the FIGURE. The printed circuit boards may be spaced equally apart from one another, thus to predetermine a constant rate in terms of printed circuit boards provided to container 20 per unit time.

Each PCB is subject to several treatment steps as it proceeds toward the container. First, an applicator 28 is used to deposit solder 30, usually in paste form, to the top surface of the PCB. Downstream is a pick-and-place device 32, which aligns one of circuit components 26 with its associated PCB 24, places the component onto the PCB, then releases the component so that the component remains mounted on the PCB, held by the solder paste. It is to be appreciated that any appropriate number of pick-and-place devices and circuit components may be employed in connection with each printed circuit board (PCB).

Inside of container 20 is an internal endless belt conveyor 34. Conveyor 34, however, is operated intermittently rather than continuously. More particularly, conveyor 34 can be operated at the same linear speed as input conveyor 18, to facilitate transfer of each printed circuit board 24 from the downstream end of the input conveyor to the upstream end of the chamber conveyor at an entrance 36 of container 20. When the PCB and component reach a treatment site within the container, as shown for PCB 24b and component 26b, internal conveyor 34 is halted and remains stationary for a predetermined time period during which reflow soldering takes place. Thus, the printed circuit board and component remain stationary during the reflow soldering operation.

The reflow soldering operation proceeds according to a predetermined reflow profile, in which the temperature inside container 20 is controllably increased until it exceeds the melting temperature of the solder, after which the solder is cooled and solidifies, providing the desired structural and electrical connections. Each printed circuit board and its associated components remain stationary during the entire profile, i.e. during cooling as well as reflow.

After the predetermined time period, chamber conveyor 34 is reactuated to carry the soldered assembly to an exit 38 of container 20. At the exit, the soldered assembly is transferred from the downstream end of conveyor 34 to the upstream end of output conveyor 22. To facilitate this transfer, conveyors 34 and 22 are operated at a predetermined rate of speed. Accordingly, conveyor 22 carries the soldered assemblies away from container 20 at a predetermined rate of speed, resulting in a continuous in-line automated system.

Container 20 includes a stationary enclosure top 42, and an enclosure bottom 40 mounted directly below. Enclosure top 42 and enclosure bottom 40 cooperate to define a chamber 44 where the reflow operation takes place. Enclosure bottom 40 is reciprocable between an open position (FIG. 2) for allowing PCBs and components to enter and exit the container, and a closed position (FIG. 1) closing the container and providing a fluid tight seal between chamber 44 and the environment just outside of container 20.

During reflow soldering, the environment within container 20 is precisely controlled, particularly as to temperature, but also as to pressure and the nature of the atmosphere. Fluid conduits connected to container 20 include a line 46 connected to a pressurized air source 48, a line 50 coupled to a source of nitrogen 52, and a vacuum line 54 coupled to a vacuum pump 56. These lines are controlled by valves, indicated respectively at 58, 60, and 62.

Radiant heating elements 64 (bottom) and 86 (top) are mounted in container 20 as controllable heat sources. Further, air source 48 can be heated and circulated within the chamber to increase the percentage of heat applied by convection. Air source 48 is also used to cool the contents within the chamber. If desired, air can be introduced into the chamber at a temperature lower than ambient to accelerate the cooling process within the chamber. If desired, nitrogen source 52 can be used in place of air for convective heating and cooling.

A control system 66 controls the opening and closing of container 20, the intermittent operation of internal conveyor 34 and further operates valves 58, 60 and 62 to control the environment in chamber 44 during reflow soldering. More particularly, responsive to a PCB and component approaching container 20 on input conveyor 18, the control system actuates internal conveyor 34 and lowers enclosure bottom 40 to open the container to receive the assembly at the container entrance. Once the assembly is inside, enclosure 40 is closed while conveyor 34 continues to move the assembly rightward to a processing site, preferably approximately centered in the chamber.

Coupled to control system 66 are several signal paths or control lines through which the system controls the operation of and environment within container 20. These include lines 68, 70 and 72 between the control system and valves 58, 60 and 62, respectively. A line 74 is coupled to the motor (not shown) that drives conveyor 34 for actuation and halting of the conveyor. A control line 76 is coupled to govern the opening and closing of the container.

All of the control functions can be governed by the control system, set in view of the desired reflow profile and synchronized with conveyors 18 and 22. However, to enhance process control and provide for an alarm or shutdown in response to an unacceptable departure from desired conditions, control system 66 preferably receives several sensing inputs, including a line 77 providing the chamber temperature, a line 78 providing chamber pressure, and a line 80 indicating whether container 20 is occupied by a PCB/component assembly.

With the assembly at the processing site, control system 66 halts internal conveyor 34 and actuates the appropriate environmental controls to facilitate the reflow soldering operation. Typical initial control steps involve only the temperature, in particular opening of valve 58 and/or providing current to heating element 64 to controllably raise the temperature in chamber 44. If a nitrogen atmosphere is desired, valve 62 is actuated as well, to at least partially evacuate the chamber. Upon sufficient evacuation, control system 66 actuates valve 60 to supply nitrogen to the chamber. As the temperature inside chamber 44 approaches and then exceeds the solder melting point, reflow occurs. Following reflow the assembly remains stationary and cools, either due to gradual heat loss from container 20 or more rapidly, by convection. During the soldering process, only conveyor 34 is halted. Conveyors 18 and 22 continue to operate at a controlled rate of speed.

Upon sensing sufficient cooling, control system 66 reactuates internal conveyor 34 and lowers enclosure bottom 40 to open the container. The opening of container 20 and the end-to-end proximity of conveyors 22 and 34 operating at a controlled rate of speed, facilitate removal of the assembly from the container. Of course, efficiency is enhanced when a single opening of the container accommodates the exit of a completed assembly and entrance of the next assembly for soldering.

Control system 66 can use a microprocessor. Alternatively, electrical relays and similar components can be used to control system functions.

As compared to the conventional system in which components are soldered while moved through an elongated tunnel, system 16 affords several distinct advantages. In view of the substantially reduced size requirements, container 20 costs less and requires less space than conventional reflow equipment. The small size considerably improves precision in controlling process conditions. The chamber can be more rapidly heated or cooled. Temperature throughout the chamber tends to be more uniform due to its smaller size. Also, because of the fluid tight seal, chamber 44 can be evacuated and nitrogen provided for a rapid and complete change in chamber atmosphere that cannot be duplicated in conventional in-line systems.

Container 20 is shown in greater detail in FIG. 2. In the present embodiment, enclosure top 42 is fixed, e.g. to a common platform 82 that also supports the input and output conveyors. Lifting mechanisms 84 (which could include pneumatic, hydraulic, screw drive or other type drive mechanisms) are connected to enclosure bottom 40 and an opposite end to a location fixed relative to platform 82. In FIG. 2, mechanism 84 lowers enclosure bottom 40 to open container 20 for soldering operations.

Also seen in FIG. 2, conveyor 34 is housed entirely within container 20. Heating element 64 within enclosure bottom 40 and heating element 86 within enclosure top 42 provide infrared heating when desired. Lower gasket 88 of the enclosure bottom 40 and a complementary upper gasket 90 of enclosure top 42 cooperate to provide the desired fluid tight seal when the container is closed.

Soldering system 16 can employ containers of different types, so long as the requisite seal and control over the container are provided. For example, FIG. 3 illustrates a container 92 including a stationary base 94 and four cylindrical columns indicated by 96 (of which two or more could be lifting mechanisms) extending upward from the base. Columns are attached to cover 100 and base 94 to allow vertical movement between open and closed positions.

System 16 has a throughput rate limited by the reflow profile, i.e. the predetermined time of the soldering operation. To overcome this limitation, a reflow soldering system 110 (FIG. 5) incorporates three containers 112*a–c*, arranged in series along the downstream region of an input conveyor 114. On the opposite side of the containers is an output conveyor 116, particularly its upstream region. Containers 112a–c can be conveniently considered as providing a reflow soldering station, in which printed circuit boards and components arriving on conveyor 114 can be selectively diverted toward any one of the containers. Guide plates 118a–c associated with containers 112a–c are employed in concert to select the appropriate container. Guideplates 118a and 118b are pivotable between a capture position (plate 118b) for diverting a PCB/component assembly from conveyor 114 toward container 112b, and a bypass position (plate 118a) in which the assembly is allowed to travel past container 112a. Guideplate 118c is fixed in the capture position. Input conveyor segments 120, 122 and 124 carry diverted assemblies to the entrances of containers 112a, 112b and 112c, respectively. Respective output conveyor segments 126, 128 and 130 transport soldered assemblies to output conveyor 116.

The capacity of system 110 is governed by the formula:

$$a \leq n/T$$

where a is the throughput rate in terms of assemblies per unit time; n is the number of containers 112 and T is the predetermined, or controlled, time period for the complete soldering process including entry into and exit from the container. Thus, assuming the same predetermined, or controlled, time period, system 110 potentially triples the available throughput rate. It is to be appreciated that any desired number of containers can be employed in system 110, depending on the desired throughput.

Provision of several containers results in a need to divert each successive assembly to an appropriate container. To this end, a control system 132 can be programmed to divert assemblies in round-robin or daisy-chain fashion in a sequence appropriately synchronized to the speeds of conveyors 114 and 116. Alternately, the control system can receive an input corresponding to each container as to whether the container is occupied and divert each assembly to the first available container in the series.

Figure 5:
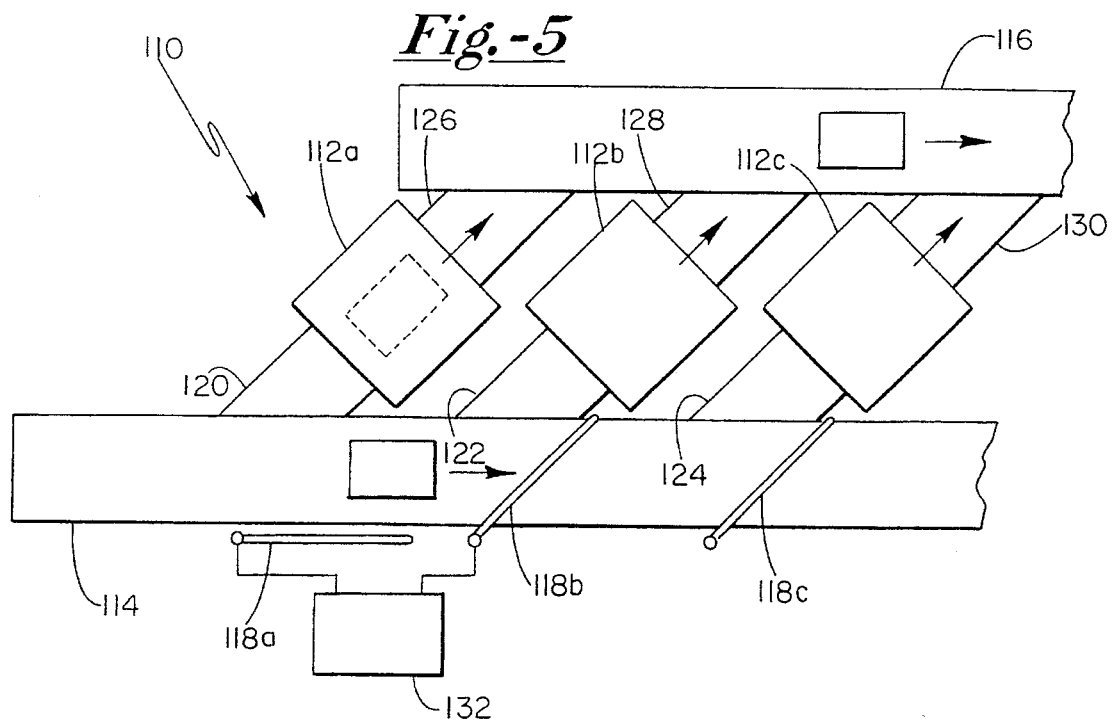
FIG. 5 is a schematic view of an alternative embodiment reflow soldering system employing several soldering containers in series.

While not illustrated in FIG. 5, it is to be appreciated that the microprocessor is coupled to separate temperature sensing and pressure sensing lines corresponding to each of the containers. Further, individual control lines are coupled to each container for controlling its opening and closing and its associated internal conveyor. Finally, individual lines provide air and inert gas and draw a vacuum in each container. However, the system can employ single sources of pressurized air and inert gas, and one vacuum pump.

Figure 6:
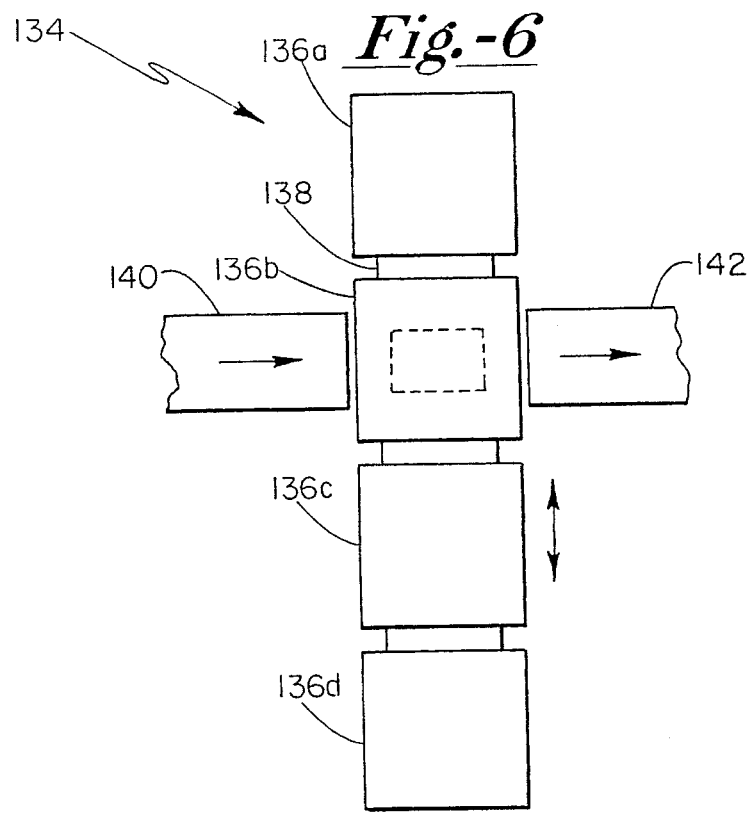
FIGS. 6 and 7 schematically illustrate further alternative embodiment reflow soldering systems.

FIG. 6 shows an alternative embodiment reflow soldering system 134 in which four containers 136a–d are mounted on a platform 138 which intersects a product path determined by an input conveyor 140 and an output conveyor 142. Considering the product path as longitudinal, platform 138 is transverse and is reciprocal in the transverse direction to selectively position any one of containers 136a–d along the product path. The respective clamshell bases of the containers are reciprocated transversely, fixed with respect to platform 138.

Selection of the appropriate container can be accomplished on a round-robin basis, or in response to a control system sensing of the available open container or containers. This system is perhaps less preferred than those previously discussed, as the PCB/component assembly does not remain stationary throughout the soldering operation.

Figure 7:
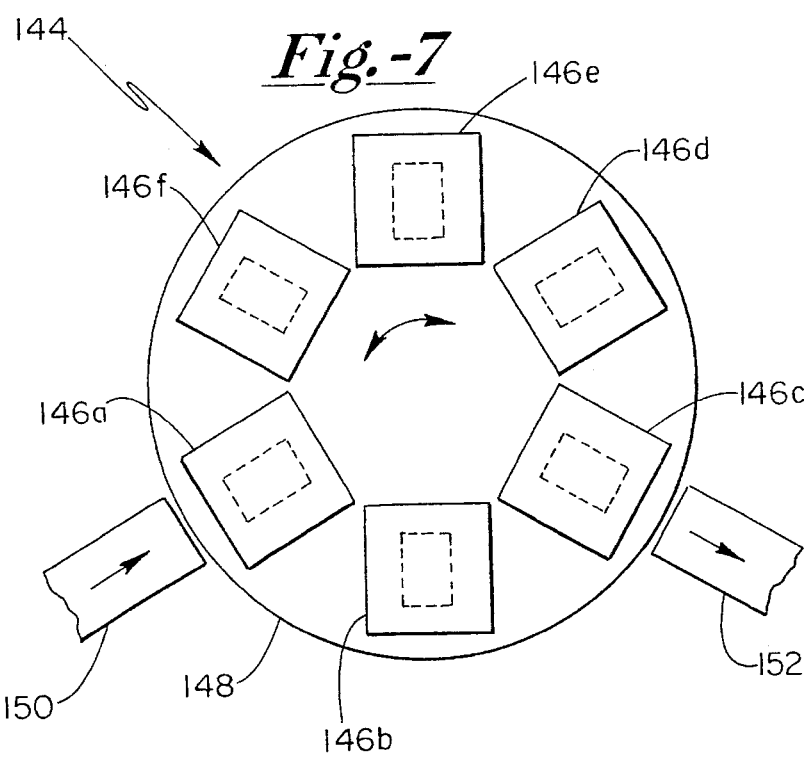

FIG. 7 illustrates a further embodiment system 144 in which six containers 146a–f are distributed angularly around the periphery of a circular platform 148. An input conveyor 150 carries PCB/component assemblies to platform 148 for entry into a selected container, while an output conveyor 152 carries soldered assemblies away from the platform. Platform 148 is rotated in stepped fashion to align successive containers 146 with the conveyors. In this arrangement, the entrance and exit are on the same end of each container, i.e. the radially outward end. Accordingly, the internal conveyor must be reversible to carry each assembly radially inward for soldering, then radially outward after soldering is complete.

The above-discussed reflow soldering systems all afford the advantages of reduced cost and space requirements due to the relatively small size of the soldering containers. Also, the ability to form a substantially fluid-tight seal, in combination with the container size, affords a degree of process control not available in conventional in-line reflow soldering systems. The multiple container embodiments provide the further advantages of increased throughput rates and flexibility in system size and capacity.

What is claimed is:

1. A process for connecting electrical circuit components to printed circuit boards, including the steps of:
   (a) conveying a plurality of printed circuit boards in sequence and at a controlled rate along a path;
   (b) applying a solder paste to each of the printed circuit boards as it travels along the path;
   (c) after applying the solder paste, placing an electrical circuit component onto the printed circuit board as the printed circuit board travels along the path;
   (d) directing each successive printed circuit board and circuit component, in sequence, to a different one of a plurality of soldering containers;
   (e) with each said printed circuit board and circuit component inside of its associated container, closing the container to form a fluid-tight seal between the inside of the container and the environment outside of the container;
   (f) while each container is closed, controllably altering the environment within the container to perform a solder reflow operation on the associated printed circuit board and circuit component;
   (g) after each reflow soldering operation, opening each of the containers to permit removal of the associated printed circuit board and circuit component, and conveying the printed circuit boards and circuit components away from the soldering station in sequence and at said controlled rate.

2. The process of claim 1 further including:
   maintaining each printed circuit board and circuit component stationary within the associated container during said reflow operation.

3. The process of claim 1 wherein:
   said step of controlling the environment includes drawing a partial vacuum in each of the containers, followed by supplying an inert gas to each of the containers.

4. The process of claim 3 including the further step of:
   heating the inert gas inside each of the containers, whereby the inert gas heats the associated printed circuit board and circuit component by convection.

5. A reflow soldering system, including:
   (a) a reflow soldering station having at least one soldering container, wherein each of the soldering containers includes:
      (i) an entrance and an exit;
      (ii) a receptacle means;

(iii) a closure means cooperating with the receptacle means to define a chamber for containing one of a plurality of articles undergoing a reflow soldering operation;

(iv) a means for reciprocating the closure means relative to the receptacle means between an open position to allow passage of the articles into and out of the container, and a closed position for closing the container to form a fluid-tight seal between the chamber and the environment outside of the container;

(v) a chamber conveyance means inside of the chamber, for carrying the articles from the entrance to the exit;

(vi) a conveyance control means for halting the chamber conveyance means to position said one of the articles at a processing site in the chamber for a selected time period, and for reactuating the conveyance means after the selected time period to carry said one of the articles to the exit;

(vii) a closure control means for closing the container, maintaining the container closed during said selected time period, and opening the container after the selected time period; and (viii) an environmental control means, operable at least during said selected time period, for controllably altering the environment in the chamber to conditions that facilitate the reflow operation;

(b) an input conveyance means for transporting the articles in sequence at a controlled rate to the reflow soldering station and delivering said one of the articles to the entrance before said selected time period; and (c) an output conveyance means for removing said one of the articles from the exit and transporting the articles away from the soldering station in sequence at the controlled rate.

6. The apparatus of claim 5 wherein:

said reflow soldering station includes a plurality of the soldering containers, and wherein the input conveyance means includes a container selection means for directing succeeding ones of the articles to different ones of said containers.

7. The apparatus of claim 6 wherein:

said input conveyance means includes an endless belt conveyor, and the selection means includes means for individually positioning successive ones of the containers in alignment with the endless belt conveyor.

8. The apparatus of claim 5 wherein:

said reflow soldering station includes a plurality of the soldering containers, and wherein said input conveyance means includes a sensing means for detecting which of the containers is unoccupied by one of the articles, and an adjustable guide means responsive to the detection means for directing each succeeding one of the articles to the entrance of an unoccupied one of the containers.

9. The apparatus of claim 8 wherein:

the input conveyance means includes means for transporting the articles past occupied ones of the containers.

10. The apparatus of claim 5 wherein:

the chamber conveyance means includes an endless belt conveyor inside the chamber.

11. The apparatus of claim 10 wherein:

an entrance and an exit of the container are at opposite ends of the container, and the belt is unidirectional.

12. The apparatus of claim 10 wherein:

an entrance and an exit of the container are at the same end of the container, and the belt is operable in reverse directions respectively preceding and following the predetermined time period.

13. The apparatus of claim 5 wherein:

said receptacle means comprises a clamshell base, and the closure means comprises a lid pivotally connected to the clamshell base.

14. The apparatus of claim 5 wherein:

the environmental control means comprises means for heating the chamber.

15. The apparatus of claim 14 wherein:

the environmental control means further comprises a first fluid line for drawing a vacuum in the chamber, and a second fluid line for supplying an inert gas to the chamber.

16. The apparatus of claim 5 wherein:

each of the articles comprises a printed circuit board and at least one electrical circuit component, and wherein a solder applicator device is located along the input conveyance means upstream of the soldering station for applying a solder paste to each of the printed circuit boards, and wherein a pick-and-place device is positioned along the input conveyance means upstream of the soldering station and downstream of the applicator device, for placing the at least one circuit component onto the printed circuit board.

17. A reflow soldering system, including:

(a) a reflow soldering system having a plurality of soldering containers, each soldering container including:

(i) an entrance and an exit;

(ii) a receptacle means;

(iii) a closure means cooperating with the receptacle means to define a chamber for containing one of a plurality of articles undergoing a reflow soldering operation;

(iv) a means for reciprocating the closure means relative to the receptacle means between an open position to allow passage of the articles into and out of the container, and a closed position for closing the container;

(v) a chamber conveyance means inside the chamber, for transporting the articles from the entrance to the exit;

(vi) a conveyance control means for halting the chamber conveyance means to position said one of the articles at a processing site inside the chamber for a predetermined time period, and for reactuating the chamber conveyance means after the predetermined time period to carry the article to the exit;

(vii) a closure control means for closing the container, maintaining the container closed during the predetermined time period, and opening the container after the predetermined time period; and (viii) an environmental control means, operable at least during the predetermined time period, for controllably altering the environment in the chamber to conditions that facilitate the reflow operation;

(b) an input conveyance means for transporting the articles in sequence at a controlled rate to the reflow soldering station;

(c) a selection and guide means for directing successive ones of the articles to the entrances of successively selected and different ones of the containers; and (d) an output conveyance means for removing successive ones of the articles from successively selected and different ones of the containers, and transporting the articles away from the soldering station in sequence and at said controlled rate.

18. The apparatus of claim 17 wherein:

said selection and guide means selects the containers in a repeating series.

19. The apparatus of claim 17 wherein:

said selection and guide means includes a detection means for sensing whether each of the containers is occupied by one of the articles, and directs each successive one of the articles to the entrance of one of the unoccupied containers.

20. The apparatus of claim 17 wherein:

the environmental control means includes at least one of the following:

(i) a source for drawing a vacuum, and a plurality of vacuum lines for connecting each of the containers with the vacuum source;

(ii) a source of an inert gas, and a plurality of fluid lines for coupling each of the containers with the inert gas source; and (iii) a source of energy for heating each of the chambers.

* * * * *